(12) United States Patent
Takashima

(10) Patent No.: US 12,738,942 B2
(45) Date of Patent: Sep. 15, 2026

(54) PLC DEVICE AND RECORDING MEDIUM

(71) Applicant: FANUC CORPORATION, Yamanashi (JP)

(72) Inventor: Yaoki Takashima, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 345 days.

(21) Appl. No.: 18/283,628

(22) PCT Filed: Apr. 23, 2021

(86) PCT No.: PCT/JP2021/016476
§ 371 (c)(1),
(2) Date: Sep. 22, 2023

(87) PCT Pub. No.: WO2022/224448
PCT Pub. Date: Oct. 27, 2022

(65) Prior Publication Data

US 2024/0171177 A1 May 23, 2024

(51) Int. Cl.
*H03K 19/17748* (2020.01)

(52) U.S. Cl.
CPC .............................. *H03K 19/17748* (2013.01)

(58) Field of Classification Search
CPC ........................ H03K 19/17748; G05B 19/058
See application file for complete search history.

(56) References Cited

U.S. PATENT DOCUMENTS 6,281,698 B1 * 8/2001 Sugimoto .......... G01R 31/3191 714/724
10,389,374 B1 * 8/2019 Khoshgard ......... H03M 1/1038
2015/0293515 A1 * 10/2015 Ikegami ............... G05B 19/056 700/87

(Continued)

FOREIGN PATENT DOCUMENTS

CN 104126155 A 10/2014
CN 111830895 A 10/2020
JP 2001-282327 10/2001

(Continued)

OTHER PUBLICATIONS

International Search Report issued Jul. 27, 2021 in corresponding International Application No. PCT/JP2021/016476.

*Primary Examiner* — Charles Cai
(74) *Attorney, Agent, or Firm* — Wenderoth, Lind & Ponack, L.L.P.

(57) ABSTRACT

Provided is a PLC device having a first PLC and a second PLC, the PLC device comprising: a measurement unit that causes PLC execution units of the first PLC and the second PLC to execute test run of a sequence program and measures a period between start and end of the sequence program for each of the first PLC and the second PLC; a timing adjustment information calculation unit that uses the measured periods to calculate timing adjustment information including at least one of an execution time and execution cycle in cyclic execution of the sequence program by the first PLC and the second PLC; and a timing adjustment information setting unit that sets the timing adjustment information calculated by the timing adjustment information calculation unit in at least any one of the first PLC and the second PLC.

5 Claims, 14 Drawing Sheets

(56) References Cited

U.S. PATENT DOCUMENTS

| | | | | |
|---|---|---|---|---|
| 2020/0050167 | A1* | 2/2020 | Canedo ................ | G05B 19/052 |
| 2022/0317648 | A1* | 10/2022 | Maruyama ............ | G06F 11/302 |

FOREIGN PATENT DOCUMENTS

| | | |
|---|---|---|
| JP | 2001-282328 | 10/2001 |
| JP | 2002-108419 A | 4/2002 |
| JP | 2004-62872 | 2/2004 |
| JP | 2004-199670 | 7/2004 |
| JP | 2019-219894 | 12/2019 |

* cited by examiner

1
IO INPUT/OUTPUT APPARATUS
10a
IO INPUT/OUTPUT APPARATUS
10b
SAFETY PLC APPARATUS
20
PLC
21a
PLC
21b
23
COMMUNICATION UNIT
22
PLC PROGRAMMING APPARATUS
30

EXECUTION RESULT

| | | | |
|---|---|---|---|
| EXECUTION CYCLE | 2ms | | |
| SYSTEM 1 | 1.2ms | 50% | 1ms |
| SYSTEM 2 | 2.4ms | 100% | 2ms |

CANCEL SET

Figure 6:
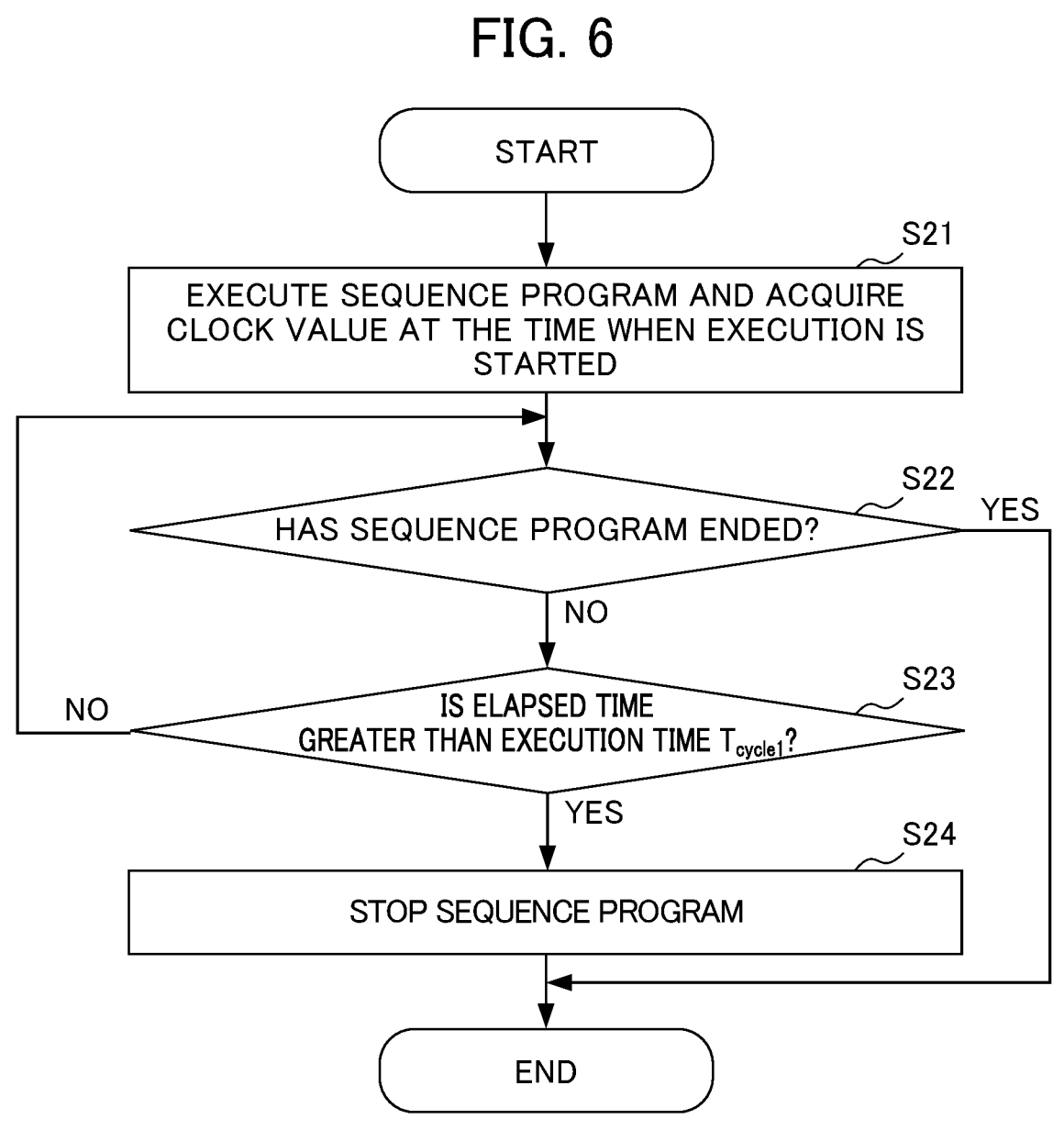

START

S21 EXECUTE SEQUENCE PROGRAM AND ACQUIRE CLOCK VALUE AT THE TIME WHEN EXECUTION IS STARTED

S22 HAS SEQUENCE PROGRAM ENDED?

YES

NO

S23 IS ELAPSED TIME GREATER THAN EXECUTION TIME $T_{cycle1}$?

NO

YES

S24 STOP SEQUENCE PROGRAM

END

FIG. 7

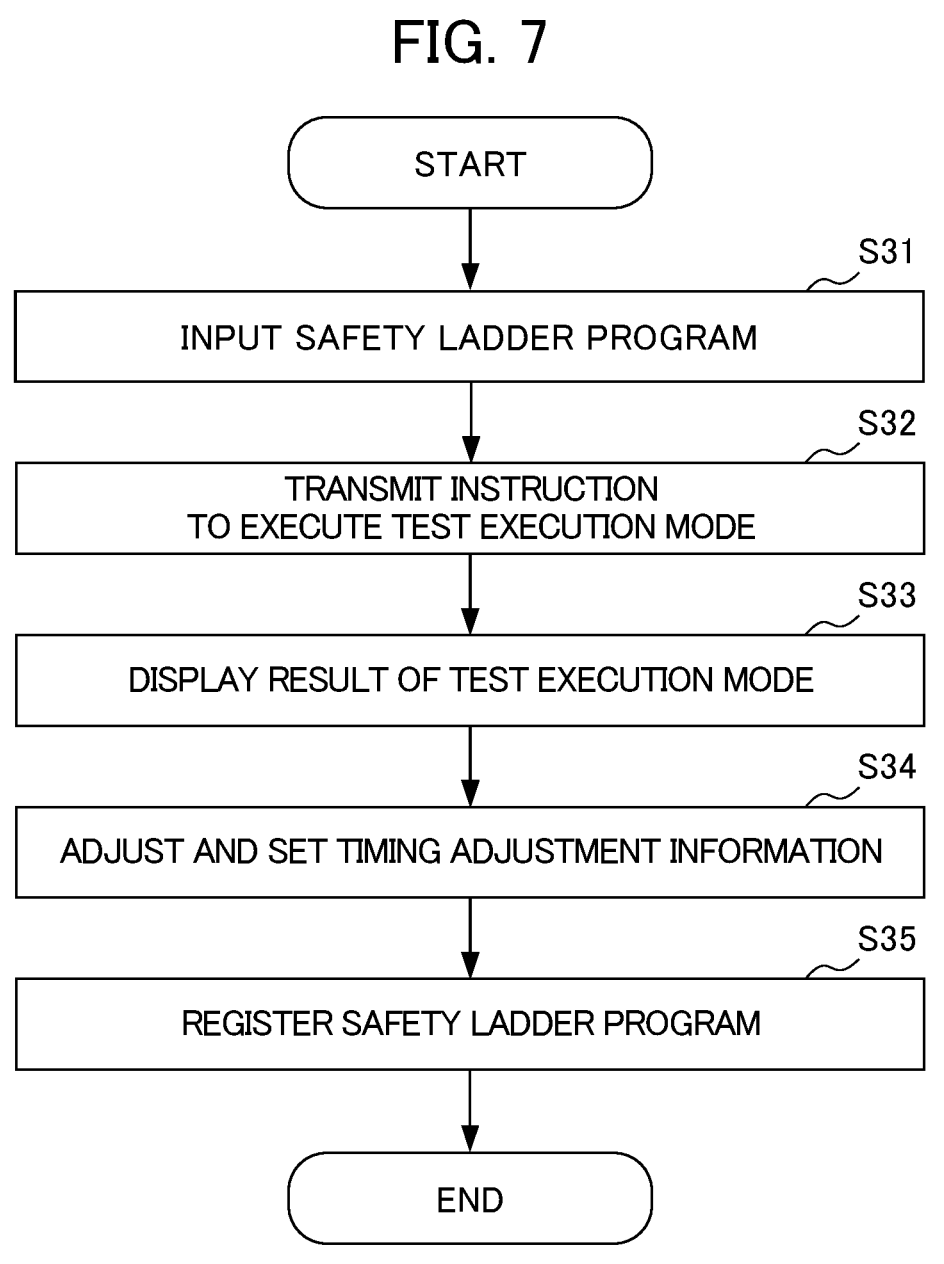

START

S31 INPUT SAFETY LADDER PROGRAM

S32 TRANSMIT INSTRUCTION TO EXECUTE TEST EXECUTION MODE

S33 DISPLAY RESULT OF TEST EXECUTION MODE

S34 ADJUST AND SET TIMING ADJUSTMENT INFORMATION

S35 REGISTER SAFETY LADDER PROGRAM

END

FIG. 8

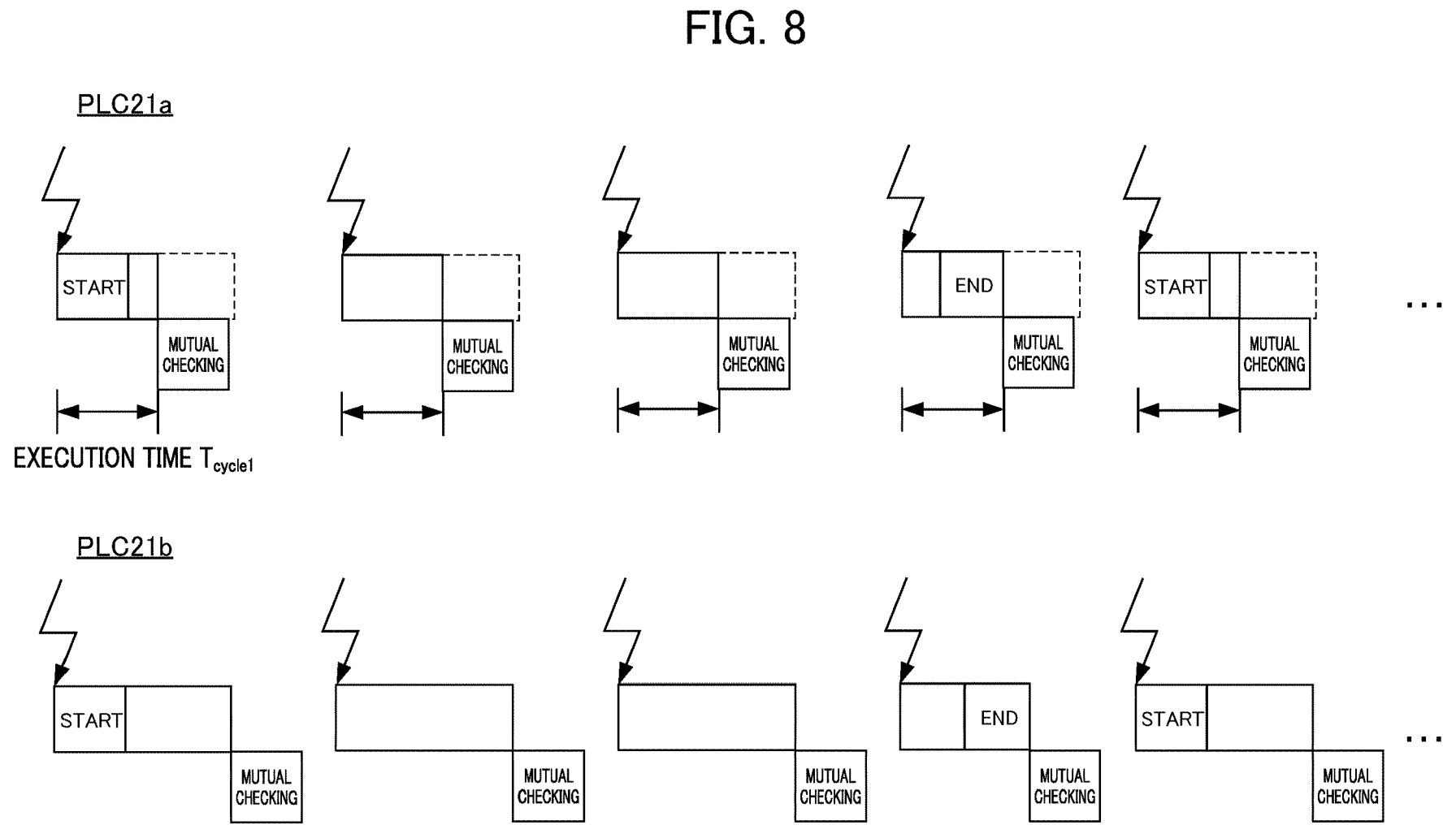

PLC21a

START

MUTUAL CHECKING

EXECUTION TIME $T_{cycle1}$

MUTUAL CHECKING

MUTUAL CHECKING

END

MUTUAL CHECKING

START

MUTUAL CHECKING

PLC21b

START

MUTUAL CHECKING

MUTUAL CHECKING

MUTUAL CHECKING

END

MUTUAL CHECKING

START

MUTUAL CHECKING

Figure 12:
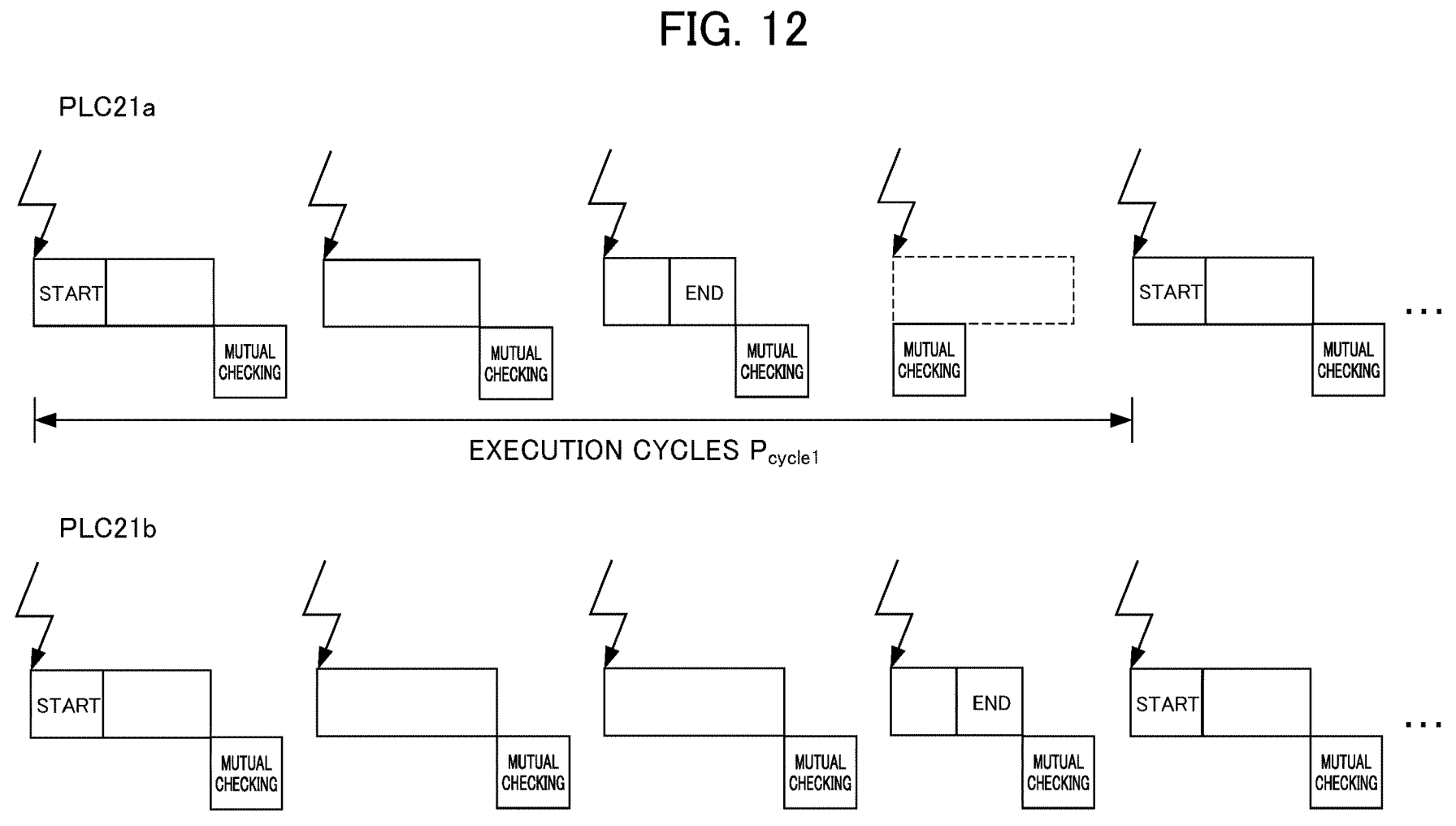

PLC21a

START

MUTUAL CHECKING

MUTUAL CHECKING

END

MUTUAL CHECKING

MUTUAL CHECKING

START

MUTUAL CHECKING

EXECUTION CYCLES $P_{cycle1}$

PLC21b

START

MUTUAL CHECKING

MUTUAL CHECKING

MUTUAL CHECKING

END

MUTUAL CHECKING

START

MUTUAL CHECKING

FIG. 15

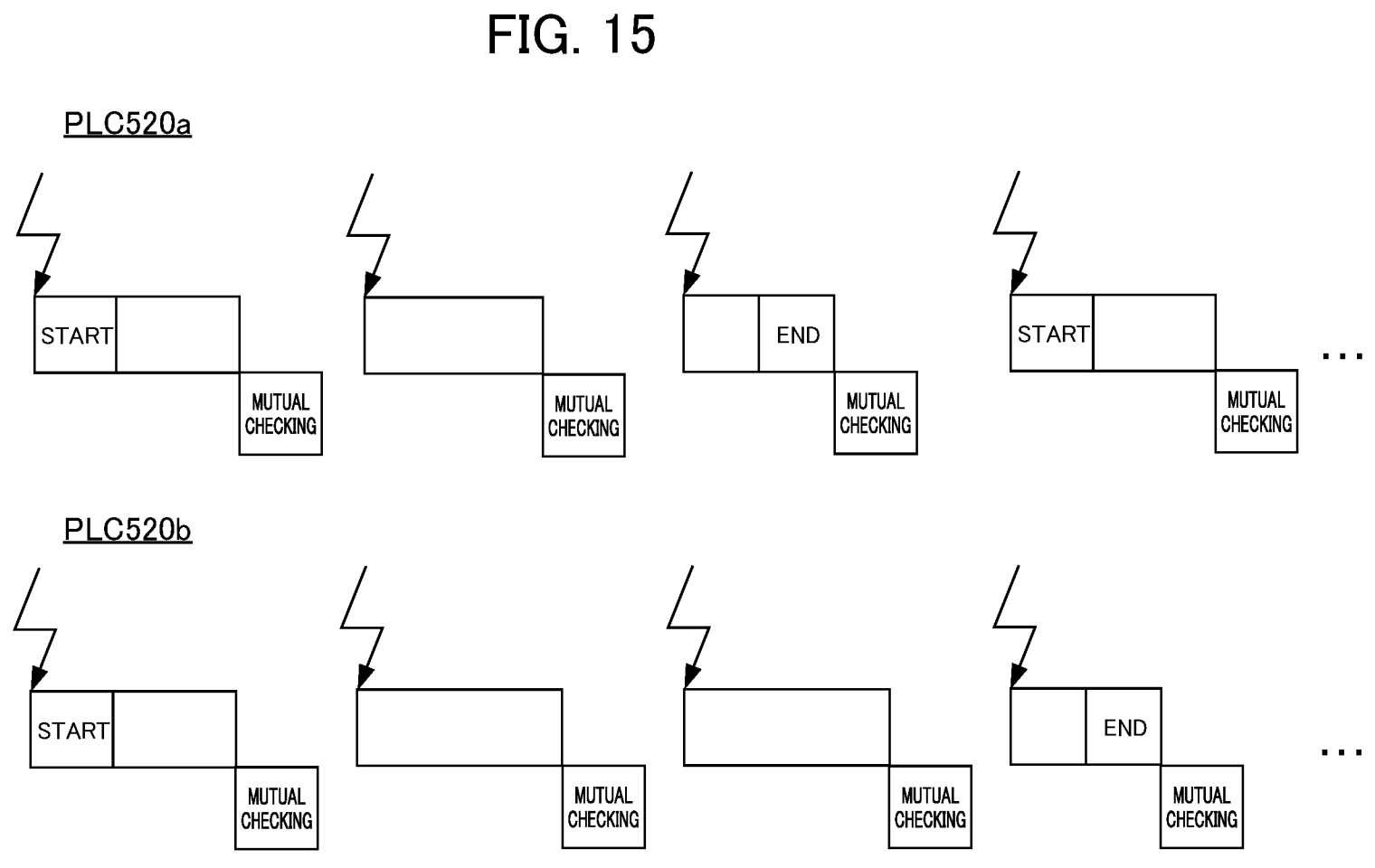

PLC520a

START
MUTUAL CHECKING
MUTUAL CHECKING
END
MUTUAL CHECKING
START
MUTUAL CHECKING

PLC520b

START
MUTUAL CHECKING
MUTUAL CHECKING
MUTUAL CHECKING
END
MUTUAL CHECKING

PLC520a
PLC520b
START
END
MUTUAL CHECKING

PLC DEVICE AND RECORDING MEDIUM

TECHNICAL FIELD

The present invention relates to a PLC apparatus and a recording medium.

BACKGROUND ART

There is proposed a technique for, in a safety PLC duplicated for functional safety, detecting a failure by mutually comparing signals. See, for example, Patent Document 1.

Patent Document 1: Japanese Unexamined Patent Application, Publication No. 2019-219894

DISCLOSURE OF THE INVENTION

Problems to be Solved by the Invention

FIG. 13 is a diagram showing an example of a PLC 520 without functional safety.

In the case of the PLC 520 without functional safety as shown in FIG. 13, if there is a problem such as a failure in any of an IO unit 510, the PLC 520, an IO unit 530, and a breaker 540 during a period from when emergency stop is inputted by an emergency stop button 500 being pressed down by a user until power to a motor 550 is actually cut off, a serious accident may be caused.

FIG. 14 is a diagram showing an example of PLCs 520*a* and 520*b* with functional safety.

As shown in FIG. 14, the PLCs 520*a* and 520*b* of two systems are provided. Therefore, even if there is a problem in any of the IO unit 510, the PLC 520*a* (or 520*b*), the IO unit 530, and the breaker 540 of one system, emergency stop works by the other system. Further, the PLCs 520*a* and 520*b* of the two systems can detect a failure (such as a different arithmetic operation result, no response, or the like) by monitoring each other.

If the duplicated PLCs 520*a* and 520*b* are configured with the same parts and the same design, however, there is a risk that they stop working at the same time due to a common trouble or part failure, or the like (referred to as a "common cause failure" in functional safety standards).

Therefore, in order to avoid the risk of the common cause failure, measures for increasing reliability of functional safety may be taken by constructing the systems using the PLCs 520*a* and 520*b* with different parts and designs for diversity.

In the two PLCs 520*a* and 520*b* using different parts and designs, however, difference in performance such as processing speed occurs.

For example, FIG. 15 schematically shows a time series of processing operation in the two PLCs 520*a* and 520*b* in a case where the PLCs 520*a* and 520*b* are mounted with a CPU made by A Company and a CPU made by B Company, respectively, and, when the same sequence program is executed with a fixed-cycle timer, the execution is completed in three cycles by the CPU made by A Company but in four cycles by the CPU made by B Company.

As shown in FIG. 15, in the fourth cycle, the PLC 520*b* ends a scanning process, but the PLC 520*a* starts the next scanning process. In this case, if the PLC 520*a* starts the scanning process even though the program of the PLC 520*b* has not ended, deviation occurs between counters and calculation results of the PLCs 520*a* and 520*b*.

FIG. 16 is a diagram showing an example of a method for synchronizing the two PLCs 520*a* and 520*b*.

As shown in FIG. 16, in a sequence program for the PLC 520*a* with the CPU with a high execution speed, the sequence program is modified not to perform any processing in the fourth cycle indicated by a broken-line rectangle, for example, in order that the PLC 520*a* does not start a new execution process (a scanning process) until execution of the PLC 520*b* is completed.

However, though the performance difference between the two PLCs 520*a* and 520*b* can be approximately estimated from specification values of the CPUs and benchmarks of the PLC manufactures, it is difficult to estimate time required for an actual process because the performance difference depends on a configuration/content of the sequence program operating in the PLCs 520*a* and 520*b*. Further, it is necessary to carefully design the sequence program so that malfunction does not occur due to difference between execution speeds of the sequence program caused by the performance difference, which is a burden on a user such as an engineer who designs a functional safety system.

Therefore, it is desired to make it possible to absorb the performance difference between the two PLCs, for example, by setting a parameter for a PLC apparatus without modifying the sequence program in order to eliminate the difference between the execution speeds and, thereby, eliminate the burden on a user who designs a functional safety system.

Means for Solving the Problems (1) One aspect of a PLC apparatus of the present disclosure is a PLC apparatus including a first PLC and a second PLC, the PLC apparatus causing a PLC execution unit of each of the first PLC and the second PLC to perform test execution of a sequence program, the PLC apparatus including: a measurement unit configured to measure time required by the PLC execution unit of each of the first PLC and the second PLC from start to end of the sequence program; a timing adjustment information calculation unit configured to calculate, based on the time measured by the measuring unit, timing adjustment information including at least either execution time or execution cycles in cyclic execution of the sequence program in the first PLC and the second PLC; and a timing adjustment information setting unit configured to set the timing adjustment information calculated by the timing adjustment information calculation unit; wherein the timing adjustment information is set for at least any one of the first PLC and the second PLC.

(2) One aspect of a recording medium of the present disclosure is computer-readable recording medium recording therein a program for causing a computer to function as the following units to cause a PLC execution unit of each of the first PLC and the second PLC to perform test execution of a sequence program: a measurement unit configured to measure time required by the PLC execution unit of each of the first PLC and the second PLC from start to end of the sequence program in the test execution; a timing adjustment information calculation unit configured to calculate, based on the measured time, timing adjustment information including at least either execution time or execution cycles in cyclic execution of the sequence program in the first PLC and the second PLC; and a timing adjustment information setting unit configured to set the calculated timing adjustment information for the first PLC or the second PLC; wherein the timing adjustment information is set for at least one of the first PLC and the second PLC.

Effects of the Invention

According to one aspect, it is made possible to absorb performance difference between two PLCs, for example, by setting a parameter for a PLC apparatus without modifying a sequence program in order to eliminate difference between execution speeds and, thereby, eliminate a burden on a user who designs a functional safety system.

BRIEF DESCRIPTION OF THE DRAWINGS

FIG. 5 is a flowchart illustrating a process of each of the PLCs in a test execution mode;

FIG. 6 is a flowchart illustrating a process of each of the PLCs in a cyclic execution mode;

FIG. 7 is a flowchart illustrating an adjustment/setting process of a PLC programming apparatus;

FIG. 8 is a diagram showing an example of operations of PLCs in the cyclic execution mode when execution time of a PLC has been adjusted;

FIG. 10 is a flowchart illustrating a process of each of the PLCs in the test execution mode;

FIG. 12 is a diagram showing an example of operations of the PLCs in the cyclic execution mode when the execution cycles of a PLC has been adjusted;

FIG. 15 is a diagram schematically showing a time series of processing operations in two PLCs.

PREFERRED MODE FOR CARRYING OUT THE INVENTION

First Embodiment

First, an outline of the present embodiment will be described. In the present embodiment, a safety PLC apparatus that includes a first PLC and a second PLC causes each of the first PLC and the second PLC to perform test execution of a sequence program, and measures time required by each of the first PLC and the second PLC from the start to end of the sequence program. The safety PLC apparatus calculates timing adjustment information about execution time for cyclic execution of the sequence program by each of the first PLC and the second PLC based on the measured time. The safety PLC apparatus transmits the calculated timing adjustment information to an external PLC programming apparatus, and makes a setting for at least any one of the first PLC and the second PLC, based on a setting instruction from the PLC programming apparatus.

Thereby, according to the present embodiment, it is possible to solve the subject of "making it possible to absorb performance difference between two PLCs, for example, by setting a parameter for a PLC apparatus without modifying the sequence program in order to eliminate difference between execution speeds and, thereby, eliminating a burden on a user who designs a functional safety system" stated in the section of "Problems to be Solved by the Invention".

/The present embodiment has been outlined above.

Next, a configuration of the present embodiment will be described in detail using drawings. Here, a case will be exemplified where the execution speed of the first PLC is higher than the execution speed of the second PLC, and execution time in the timing adjustment information about the first PLC is adjusted. The present invention is also applicable to a case where the execution speed of the second PLC is higher than the execution speed of the first PLC, and a case where the execution time in the timing adjustment information about the first PLC and the execution time in the timing adjustment information about the second PLC are adjusted to a predetermined execution time.

Figure 1:
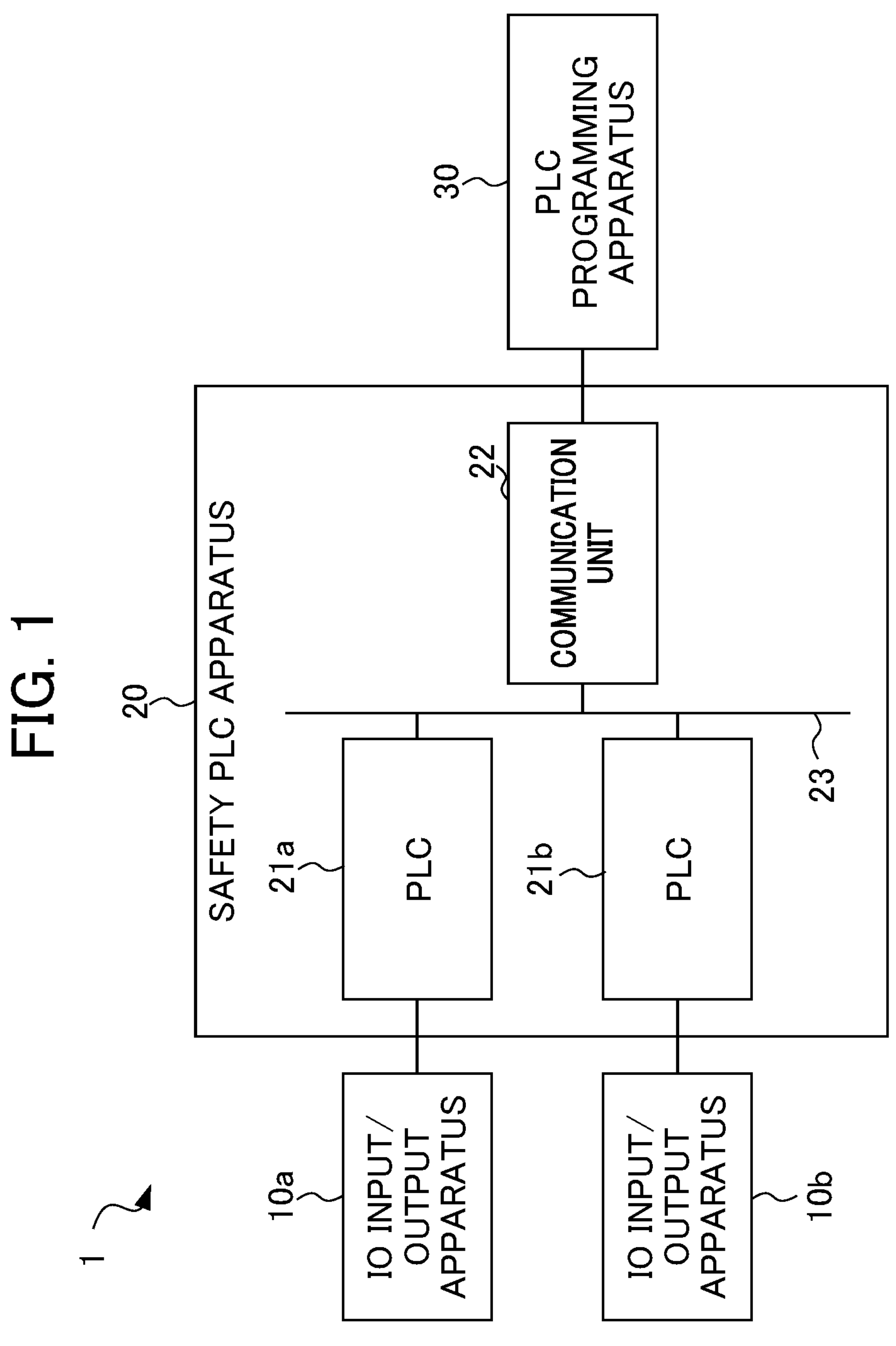
FIG. 1 is a diagram showing an example of the configuration of a functional safety system according to a first embodiment.

FIG. 1 is a diagram showing an example of the configuration of a functional safety system according to a first embodiment. As shown in FIG. 1, a functional safety system 1 has IO input/output apparatuses 10*a* and 10*b*, a safety PLC apparatus 20, and a PLC programming apparatus 30 as an external apparatus. In FIG. 1, devices such as breakers connected to the IO input/output apparatuses 10*a* and 10*b* are not shown.

The IO input/output apparatuses 10*a* and 10*b*, the safety PLC apparatus 20 as a PLC apparatus, and the PLC programming apparatus 30 may be directly connected with one another via connection interfaces not shown. The IO input/output apparatuses 10*a* and 10*b*, the safety PLC apparatus 20, and the PLC programming apparatus 30 may be mutually connected via a network such as a LAN (local area network). In this case, the IO input/output apparatuses 10*a* and 10*b*, the safety PLC apparatus 20, and the PLC programming apparatus 30 may be provided with communication units not shown for mutually performing communication via the connection.

The IO input/output apparatuses 10*a* and 10*b* are, for example, well-known switches or actuators, and control operations of the breakers and the like not shown, based on signals from the safety PLC apparatus 20 described later.

<PLC Programming Apparatus 30>

The PLC programming apparatus 30 is a computer or the like that is well known to one skilled in the art, and it creates a sequence program such as a ladder program to be executed by the safety PLC apparatus 20 described later, and transmits the created sequence program to the safety PLC apparatus 20.

Further, the PLC programming apparatus 30 includes a display unit (not shown) such as a liquid crystal display, and an input device (not shown) such as a keyboard or a touch panel arranged on a display device (not shown), or the like. For example, when one of a mode for performing test execution (an unsafe state) (hereinafter also referred to as a "test execution mode") and a mode for performing cyclic execution to which set timing adjustment information is applied (hereinafter also referred to as a "cyclic execution mode") is selected based on an input operation by the user via the input device (not shown), the PLC programming apparatus 30 may transmit an instruction to execute the selected mode to the safety PLC apparatus 20 described later. Here, the unsafe state is a state in which functional safety does not work, at the time of setup, during the apparatus is being started, and the like.

Further, as described later, when having transmitted an instruction to execute the test execution mode to the safety PLC apparatus 20, the PLC programming apparatus 30 may receive timing adjustment information about each of a PLC 21*a* as the first PLC and a PLC 21*b* as the second PLC included in the safety PLC apparatus 20, which have been calculated by the safety PLC apparatus 20 in the test execution mode, from the safety PLC apparatus 20 and display the received timing adjustment information about each of the PLCs 21*a* and 21*b* on the display device (not shown). The PLC programming apparatus 30 may transmit a setting instruction for the displayed timing adjustment information to the safety PLC apparatus 20, based on an input operation by the user via the input device (not shown).

<Safety PLC Apparatus 20>

As shown in FIG. 1, the safety PLC apparatus 20 includes the PLC 21*a* as the first PLC, the PLC 21*b* as the second PLC, and a communication unit 22. The PLCs 21*a* and 21*b* and the communication unit 22 are mutually connected via a bus 23. The bus 23 may operate as a data common bus for performing mutual checking of data between the PLC 21*a* and the PLC 21*b*.

The communication unit 22 receives a sequence program generated by the PLC programming apparatus 30 and outputs the received sequence program to the PLCs 21*a* and 21*b*. Further, the communication unit 22 may receive an instruction to perform the test execution for adjusting the timing adjustment information about each of the PLCs 21*a* and 21*b*, from the PLC programming apparatus 30 and transmit a result of the test execution to the PLC programming apparatus 30.

<PLCs 21*a* and 21*b*>

Each of the PLCs 21*a* and 21*b* is a PLC well known to one skilled in the art, which executes a sequence program such as a ladder program and performs various kinds of control, arithmetic processing, signal input/output processing, and the like based on the sequence program.

Figure 2:
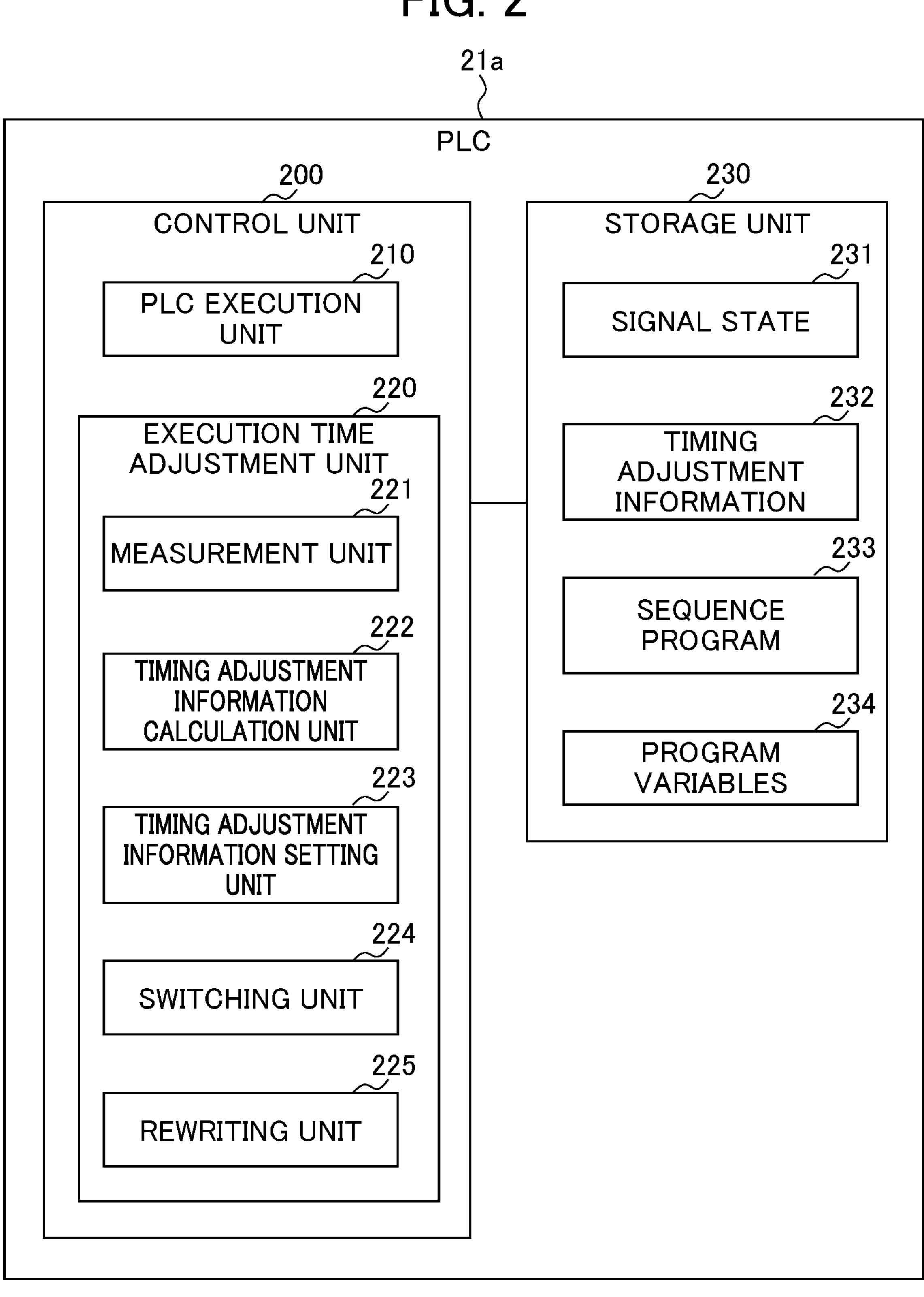
FIG. 2 is a block diagram showing the configuration of each of PLCs.

FIG. 2 is a block diagram showing the configuration of the PLC 21*a*. The configuration of the PLC 21*b* is similar to that of the PLC 21*a*, and description thereof will be omitted. Difference between the PLC 21*a* and the PLC 21*b* is difference of performance such as processing speed between the CPUs included in the PLC 21*a* and PLC 21*b*, similarly to the case of FIG. 9. For example, it is assumed that the execution speed of the PLC 21*a* as the first PLC is higher than the execution speed of the PLC 21*b* as the second PLC as described above.

As shown in FIG. 2, the PLC 21*a* includes a control unit 200 and a storage unit 230. The control unit 200 includes a PLC execution unit 210 and an execution time adjustment unit 220. The execution time adjustment unit 220 includes a measurement unit 221, a timing adjustment information calculation unit 222, a timing adjustment information setting unit 223, a switching unit 224, and a rewriting unit 225. The storage unit 230 includes a signal state 231, timing adjustment information 232, sequence programs 233, and program variables 234.

<Storage Unit 230>

The storage unit 230 is, for example, a ROM (read-only memory) or an HDD (hard disk drive), and stores a system program, a sequence program, and the like executed by the control unit 200 described later. Further, the storage unit 230 may store the signal state 231, the timing adjustment information 232, the sequence programs 233, and the program variables 234.

The signal state 231 stores, for example, log information or the like showing states of signals outputted from the control unit 200, the PLC execution unit 210, and the execution time adjustment unit 220 described later. The log information stored in the signal state 231 may include, together with the state of each signal, information showing an operation state of the PLC 21*a* (normal or abnormal such as failure), time information, and the like when the signal is outputted.

The timing adjustment information 232 stores, for example, timing adjustment information that includes execution time or execution cycles that the PLC programming apparatus 30 has given an instruction to set.

The sequence programs 233 store sequence programs such as safety ladder programs created by the PLC programming apparatus 30.

The program variables 234 store, for example, a clock value, a count value, time, and the like outputted from a CPU built-in clock, a hardware timer, or the like not shown, which are included in the control unit 200 described later.

<Control Unit 200>

The control unit 200 has a CPU, a ROM, a RAM, a CMOS (complementary metal-oxide-semiconductor) memory, and the like, which are configured to be mutually communicable via a bus and which are well known to one skilled in the art.

The CPU is a processor that performs overall control of the PLC 21*a*. The CPU reads out the system program and an application program stored in the ROM via the bus, and controls the entire PLC 21*a* according to the system program and the application program. Thereby, as shown in FIG. 2, the control unit 200 is configured to realize functions of the PLC execution unit 210 and the execution time adjustment unit 220, and the execution time adjustment unit 220 is configured to realize functions of the measurement unit 221, the timing adjustment information calculation unit 222, the timing adjustment information setting unit 223, the switching unit 224, and the rewriting unit 225. In the RAM, various kinds of data such as temporary calculation data and display data are stored. The CMOS memory is backed up by a battery not shown, and is configured as a nonvolatile memory in which a storage state is held even if the power source of the safety PLC apparatus 20 is turned off.

The PLC execution unit 210 reads out, for example, a sequence program such as a safety ladder program corresponding to an instruction to execute the test execution mode or the cyclic execution mode, from the PLC programming apparatus 30, from the sequence programs 233 of the storage unit 230, and executes the read-out sequence program. Since a well-known method can be used for operation of the PLC execution unit 210, detailed description thereof will be omitted.

For example, when the PLC execution unit 210 receives an execution instruction from the PLC programming apparatus 30 and executes a sequence program, the measurement unit 221 measures time required by the PLC execution unit 210 from start to end of the sequence program.

Specifically, for example, the measurement unit 221 stores a clock value outputted by the CPU built-in clock or the like not shown at the time when the execution of the sequence program by the PLC execution unit 210 starts, and measures elapsed time from a difference between a clock value outputted from the CPU built-in clock or the like not shown and the stored clock value. The measurement unit 221 measures time $T_{m1}$ required by the PLC execution unit 210 from the start to end of the execution of the sequence program, from a difference between a clock value outputted by the CPU built-in clock or the like not shown at the time when the execution of the sequence program by the PLC execution unit 210 ends and the clock value stored at the time of the start.

The timing adjustment information calculation unit 222 calculates timing adjustment information that includes execution time of the PLC 21*a* in the cyclic execution mode of the sequence program, based on the time required from the start to end of the execution of the sequence program, which has been measured by the measurement unit 221.

Specifically, for example, the timing adjustment information calculation unit 222 acquires time $T_{m2}$ required from start to end of execution of the sequence program, which has been measured by the measurement unit 221 of the PLC 21*b*, via the bus 23. Since the execution speed of the PLC 21*a* is higher than the execution speed of the PLC 21*b* as described above, $T_{m1} \leq T_{m2}$ is satisfied. When the maximum execution time per cycle is indicated by Td, the timing adjustment information calculation unit 222 calculates execution time $T_{cycle1}$ of the CPU of the control unit 200 of the PLC 21*a* as $T_{m1}/T_{m2} \times Td$. The timing adjustment information calculation unit 222 transmits timing adjustment information that includes the calculated execution time $T_{cycle1}$, to the PLC programming apparatus 30 via the communication unit 22.

Meanwhile, the timing adjustment information calculation unit 222 of the PLC 21*b* transmits the execution time calculated by the measurement unit 221 to the PLC programming apparatus 30 as timing adjustment information about the PLC 21*b* because the execution speed of the PLC 21*b* is lower than the execution speed of the PLC 21*a*.

The PLC programming apparatus 30 receives the timing adjustment information about each of the PLCs 21*a* and 21*b* from the safety PLC apparatus 20 and displays the received timing adjustment information about each of the PLCs 21*a* and 21*b* on the display device (not shown).

Figures 3, 4:
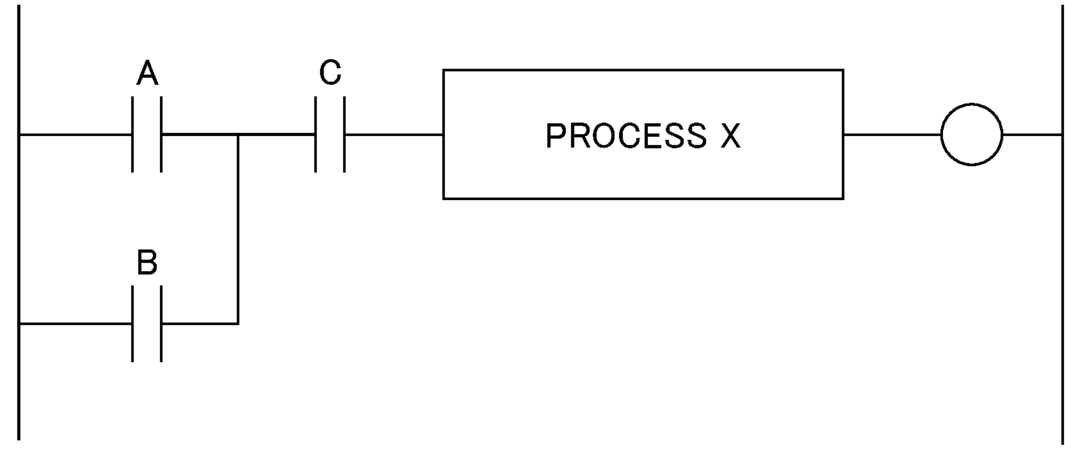
FIG. 3 is a diagram showing an example of a user interface screen for timing adjustment information.
FIG. 4 is a diagram showing an example of a sequence program that causes a process X to be executed at the time of failure.

FIG. 3 is a diagram showing an example of a user interface screen for timing adjustment information.

"Execution time" on the first row on the user interface screen in FIG. 3 indicates the maximum execution time Td per cycle and shows "2 ms". The second row on the user interface screen shows the execution time $T_{m1}$ measured in the PLC 21*a* as a system 1, a rate of execution time assigned to the PLC 21*a* relative to the execution time Td, and the assigned execution time $T_{cycle1}$. The third row on the user interface screen shows the execution time $T_{m2}$ measured in the PLC 21*b* as a system 2, a rate of execution time assigned to the PLC 21*b* relative to the execution time Td, and the assigned execution time $T_{cycle2}$.

On the user interface screen of FIG. 3, the PLC programming apparatus 30 can adjust the rate of the execution time assigned to each of the PLCs 21*a* and 21*b* relative to the execution time Td, based on an input operation by the user via the input device (not shown). In the present embodiment, since the execution speed of the PLC 21*a* is higher than the execution speed of the PLC 21*b* as described above, the execution time $T_{cycle1}$ of the PLC 21*a* is adjusted to 50% of the execution time Td, and the execution time $T_{cycle2}$ of the PLC 21*b* is adjusted so that 100% of the execution time Td is completely assigned.

After the adjustment, when a SET button is pressed down by the user via the input device (not shown), the PLC programming apparatus 30 transmits an instruction to set the adjusted timing adjustment information, to the safety PLC apparatus 20.

When receiving the setting instruction from the PLC programming apparatus 30, the timing adjustment information setting unit 223 sets the adjusted timing adjustment information for the PLC 21*a*.

Specifically, the timing adjustment information setting unit 223 stores the timing adjustment information received from the PLC programming apparatus 30 into the timing adjustment information 232 of the storage unit 230.

The switching unit 224 switches to the test execution mode or the cyclic execution mode based on an instruction from the PLC programming apparatus 30.

In order to reproduce a predetermined situation in the test execution mode, the rewriting unit 225 executes rewriting of the sequence program, rewriting of the signal state in the safety PLC apparatus 20, or rewriting of the program variables 234, based on an instruction from the PLC programming apparatus 30 via the communication unit 22.

FIG. 4 is a diagram showing an example of a sequence program that causes a process X to be executed at the time of failure.

As shown in FIG. 4, in order to execute the process X in the test execution mode, the PLC execution unit 210 depends on a signal state of ((A OR B) AND C) of A, B, and C. Therefore, if the condition does not hold unless a failure has occurred in any of the PLCs 21*a* and 21*b* as the predetermined situation, the maximum value of execution time cannot be measured. Therefore, for example, based on an instruction from the PLC programming apparatus 30, the rewriting unit 225 rewrites the signal state 231 to replace the actual state with such a signal state of A, B, and C that ((A OR B) AND C) of failure or the like is satisfied. Thereby, the PLC execution unit 210 can execute the process X in the test execution mode.

Further, the rewriting unit 225 may rewrite the counter value, time, and the like of the program variables 234 because there may be a case where it is not possible to estimate the maximum value of processing time of the sequence program unless the counter value and time stored in the program variables 234 are rewritten.

Further, the rewriting unit 225 may rewrite the sequence program itself in order to be compatible with measurement by a ladder program in which a test program is embedded, instead of rewriting of the signal state 231 or the program variables 234.

<Process of PLC 21*a* in Test Execution Mode>

Next, a flow of a process of the PLC 21*a* in the test execution mode will be described with reference to FIG. 5. As for the PLC 21*b*, a process similar to that of the PLC 21*a* is also executed.

Figure 5:
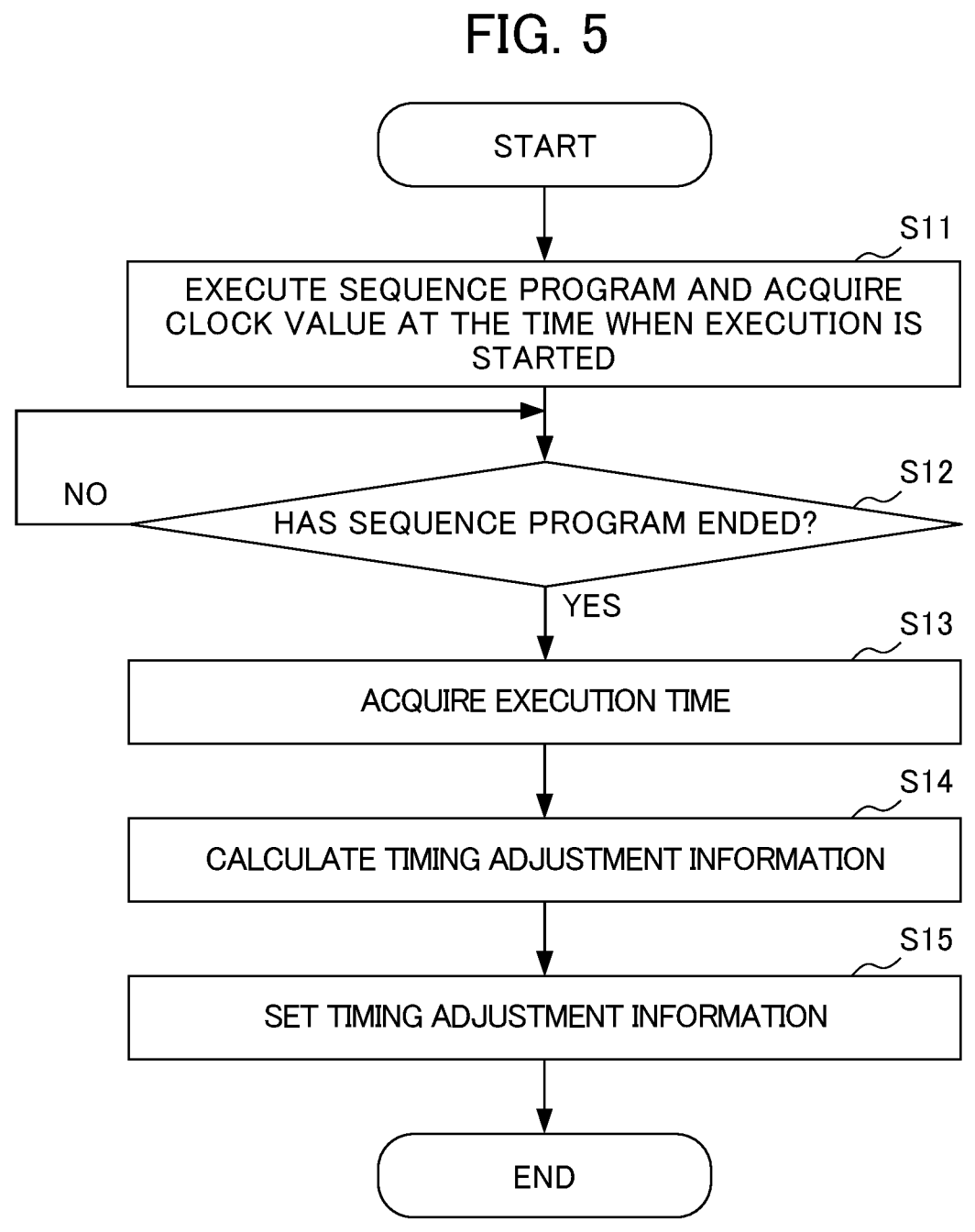

FIG. 5 is a flowchart illustrating the process of the PLC 21*a* in the test execution mode. The flow shown here is executed each time the test execution mode is received from the PLC programming apparatus 30.

At Step S11, when receiving an instruction to execute the test execution mode from the PLC programming apparatus 30, the PLC execution unit 210 starts execution of the sequence program, and the measurement unit 221 acquires a clock value outputted by the CPU built-in clock or the like not shown when the execution is started.

At Step S12, the PLC execution unit 210 judges whether the execution of the sequence program has ended or not. If the execution of the sequence program has ended, the process proceeds to Step S13. On the other hand, if the execution of the sequence program has not ended, the process waits until the execution of the sequence program ends.

At Step S13, the measurement unit 221 acquires a clock value outputted by the CPU built-in clock or the like not shown when the sequence program ends, and acquires execution time $T_{m1}$ of the PLC 21*a* from a difference between the acquired clock value and the clock value at the time of the start acquired at Step S11.

At Step S14, the timing adjustment information calculation unit 222 calculates timing adjustment information that includes execution time $T_{cycle1}$ of the PLC 21*a* in the cyclic execution mode of the sequence program, based on the execution time $T_{m1}$ acquired at Step S13. The timing adjustment information calculation unit 222 transmits the calculated timing adjustment information to the PLC programming apparatus 30.

At Step S15, when receiving an instruction to set adjusted timing adjustment information from the PLC programming apparatus 30 for the timing adjustment information transmitted at Step S14, the timing adjustment information setting unit 223 stores and sets the received timing adjustment information in the timing adjustment information 232.

<Process of PLC 21*a* in Cyclic Execution Mode>

Next, a flow of a process of the PLC 21*a* in the cyclic execution mode will be described with reference to FIG. 6. As for the PLC 21*b*, a process similar to that of the PLC 21*a* is executed.

FIG. 6 is a flowchart illustrating the process of the PLC 21*a* in the cyclic execution mode. The flow shown here is executed for each cycle of the PLC 21*a*.

At Step S21, when receiving an instruction to execute the cyclic execution mode from the PLC programming apparatus 30, the PLC execution unit 210 starts execution of the sequence program, and the measurement unit 221 acquires a clock value outputted by the CPU built-in clock or the like not shown when the execution is started.

At Step S22, the PLC execution unit 210 judges whether the execution of the sequence program has ended or not. If the execution of the sequence program has ended, the process of the cycle ends, and the process proceeds to the next cycle. On the other hand, if the execution of the sequence program has not ended, the process proceeds to Step S23.

At Step S23, the measurement unit 221 measures elapsed time from a difference between a clock value outputted from the CPU built-in clock or the like not shown and the clock value acquired at Step S21, and the PLC execution unit 210 judges whether or not the time is up by the measured elapsed time having exceeded the execution time $T_{cycle1}$. If the time is up by the measured elapsed time having exceeded the execution time $T_{cycle1}$, the process proceeds to Step S24. On the other hand, if the measured elapsed time is below the execution time $T_{cycle1}$, and the time is not up, the process returns to Step S22.

At Step S24, the PLC execution unit 210 stops the execution of the sequence program of the cycle, and transitions to the next cycle.

<Adjustment/Setting Process of PLC Programming Apparatus 30>

Next, a flow of an adjustment/setting process of the PLC programming apparatus 30 (a safety function setup mode) will be described with reference to FIG. 7.

FIG. 7 is a flowchart illustrating the adjustment/setting process of the PLC programming apparatus 30. The flow shown here is executed each time a sequence program of a safety ladder program created by a user such as a functional safety designer is inputted to the PLC programming apparatus 30.

At Step S31, the PLC programming apparatus 30 inputs a safety ladder program created by the user via the input device (not shown).

At Step S32, the PLC programming apparatus 30 transmits an instruction to execute the test execution mode to the safety PLC apparatus 20 based on an input operation of the user via the input device (not shown).

At Step S33, the PLC programming apparatus 30 receives a result of test execution in response to the execution instruction transmitted at Step S32 from the safety PLC apparatus 20, and displays the user interface screen of FIG. 3 showing the received result of the test execution on the display device (not shown).

At Step S34, the PLC programming apparatus 30 adjusts timing adjustment information on the user interface screen displayed at Step S33, and transmits a setting instruction to set the adjusted timing adjustment information, to the safety PLC apparatus 20.

At Step S35, the PLC programming apparatus 30 registers the safety ladder program inputted at Step S31 with the safety PLC apparatus 20.

FIG. 8 is a diagram showing an example of operations of the PLCs 21*a* and 21*b* in the cyclic execution mode when the execution time of the PLC 21*a* has been adjusted.

As shown in FIG. 8, the PLC 21*a* the CPU of which has a higher execution speed and the execution time of which has been adjusted is adjusted so that execution is completed in four cycles the same as the PLC 21*b*, by the maximum execution time assigned for one cycle being shortened based on the timing adjustment information.

From the above, by each of the PLCs 21*a* and 21*b* calculating timing adjustment information in the test execution mode, the safety PLC apparatus 20 according to the first embodiment can make it possible to absorb the performance difference between the two PLCs 21*a* and 21*b*, by setting, for example, a parameter for the safety PLC apparatus 20 without modifying the sequence program in order to eliminate the difference between the execution speeds and, thereby, eliminate the burden on the user who designs the functional safety system 1.

Further, the safety PLC apparatus 20 calculates a setting for a parameter related to PLC execution timing adjustment not by estimation but from actual execution time and, therefore, can set highly accurate timing adjustment information. The first embodiment has been described above.

Second Embodiment

Next, a second embodiment will be described. In the first embodiment, the safety PLC apparatus 20 adjusts the execution time of the PLC 21*a*. In comparison, in the second embodiment, the safety PLC apparatus 20 is different from the first embodiment in adjusting the execution cycles of the PLC 21*a*.

Thereby, the safety PLC apparatus 20 according to the second embodiment can make it possible to absorb the performance difference between the two PLCs 21*a* and 21*b*, by setting, for example, a parameter for the safety PLC apparatus 20 without modifying the sequence program in order to eliminate the difference between the execution speeds and, thereby, eliminate the burden on the user who designs the functional safety system 1.

The second embodiment will be described below.

A functional safety system 1 according to the second embodiment has an IO input/output apparatuses 10$a$ and 10$b$, a safety PLC apparatus 20, and a PLC programming apparatus 30 similarly to the first embodiment shown in FIG. 1.

The IO input/output apparatuses 10$a$ and 10$b$, and the PLC programming apparatus 30 have configurations similar to those of the IO input/output apparatuses 10$a$ and 10$b$, and the PLC programming apparatus 30 of the first embodiment.

The safety PLC apparatus 20 according to the second embodiment includes a PLC 21$a$ as the first PLC and a PLC 21$b$ as the second PLC, and a communication unit 22, similarly to the case of the first embodiment.

The communication unit 22 has functions similar to those of the communication unit 22 of the first embodiment.

<PLCs 21$a$ and 21$b$>

Figure 9:
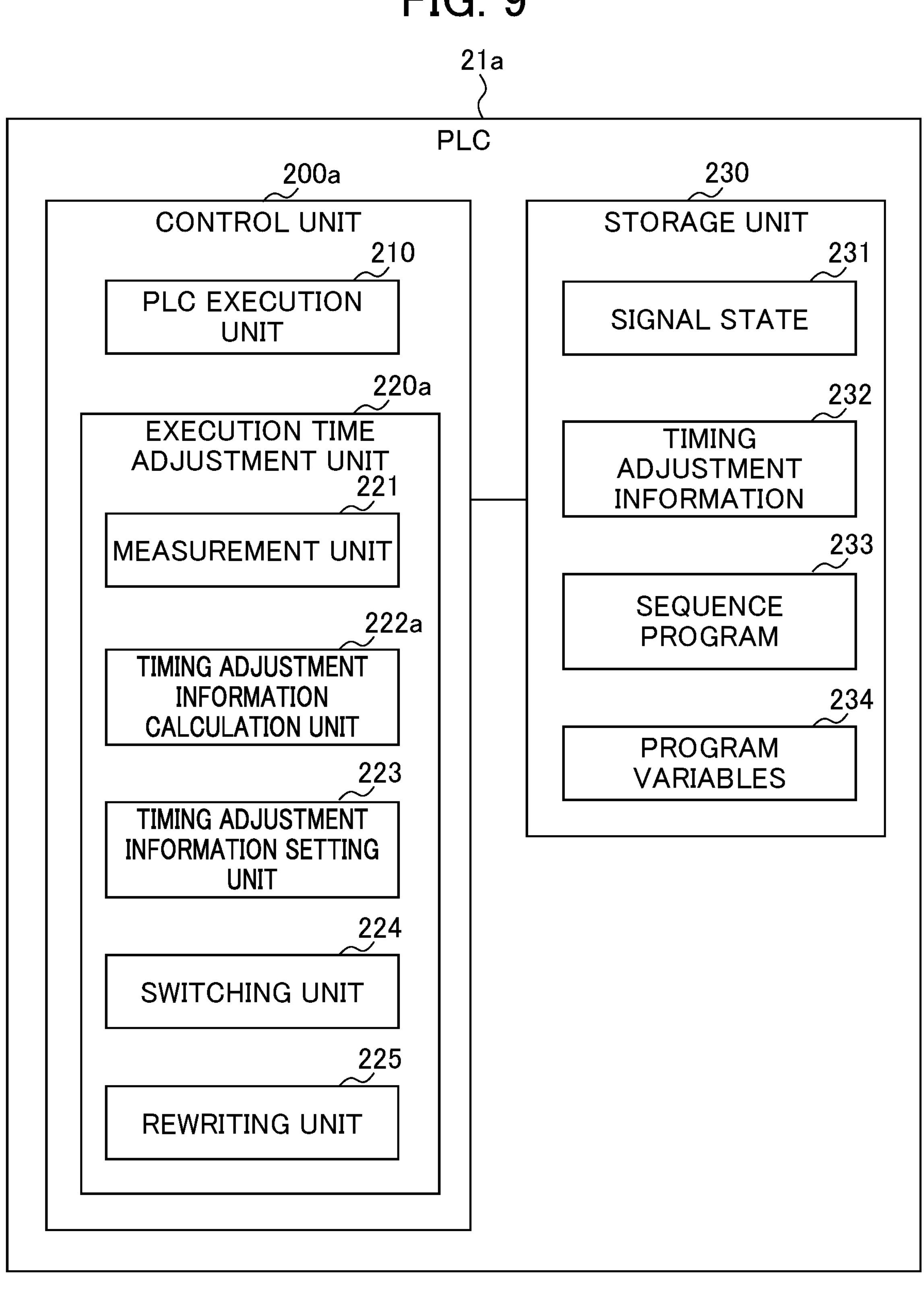
FIG. 9 is a block diagram showing the configuration of each of the PLCs.

FIG. 9 is a block diagram showing the configuration of the PLC 21$a$. Components having functions similar to those of elements of the PLC 21$a$ of FIG. 2 will be given the same reference numerals, and detailed description thereof will be omitted. The configuration of the PLC 21$b$ is similar to that of the PLC 21$a$, and description thereof will be omitted. It is assumed that difference between the PLC 21$a$ and the PLC 21$b$ is that the execution speed of the PLC 21$a$ as the first PLC is higher than the execution speed of the PLC 21$b$ as the second PLC, similarly to the case of the first embodiment.

As shown in FIG. 9, the PLC 21$a$ includes a control unit 200$a$ and a storage unit 230. The control unit 200$a$ includes a PLC execution unit 210 and an execution time adjustment unit 220$a$. The execution time adjustment unit 220$a$ includes a measurement unit 221, a timing adjustment information calculation unit 222$a$, a timing adjustment information setting unit 223, a switching unit 224, and a rewriting unit 225. The storage unit 230 includes a signal state 231, timing adjustment information 232, sequence programs 233, and program variables 234.

The PLC execution unit 210 has functions similar to those of the PLC execution unit 210 of the first embodiment.

Further, the measurement unit 221, the timing adjustment information setting unit 223, the switching unit 224, and the rewriting unit 225 have functions similar to those of the measurement unit 221, the timing adjustment information setting unit 223, the switching unit 224, and the rewriting unit 225 of the first embodiment.

Further, the signal state 231, the timing adjustment information 232, the sequence programs 233, and the program variables 234 are similar to the signal state 231, the timing adjustment information 232, the sequence programs 233, and the program variables 234 of the first embodiment.

The timing adjustment information calculation unit 222$a$ calculates timing adjustment information that includes the execution cycles of the PLC 21$a$ in the cyclic execution mode of the sequence program, based on the time required from the start to end of the execution of the sequence program, which has been measured by the measurement unit 221.

Specifically, for example, similarly to the timing adjustment information calculation unit 222 of the first embodiment, the timing adjustment information calculation unit 222$a$ acquires time $T_{m2}$ required from start to end of execution of the sequence program, which has been measured by the measurement unit 221 of the PLC 21$b$, via the bus 23. When the maximum execution time per cycle is indicated by Td, the timing adjustment information calculation unit 222$a$ calculates the execution cycles $P_{cycle1}$ of the CPU of the control unit 200 of the PLC 21$a$ as an integer rounded up from $T_{m2}$/Td. The timing adjustment information calculation unit 222$a$ transmits timing adjustment information that includes the calculated execution cycles $P_{cycle1}$ to the PLC programming apparatus 30 via the communication unit 22.

Meanwhile, the timing adjustment information calculation unit 222$a$ of the PLC 21$b$ transmits the execution cycles set in the timing adjustment information 232, to the PLC programming apparatus 30 because the execution speed of the PLC 21$b$ is lower than the execution speed of the PLC 21$a$.

<Process of PLC 21$a$ in Test Execution Mode>

Next, a flow of a process of the PLC 21$a$ in the test execution mode will be described with reference to FIG. 10. As for the PLC 21$b$, a process similar to that of the PLC 21$a$ is executed.

Figure 10:
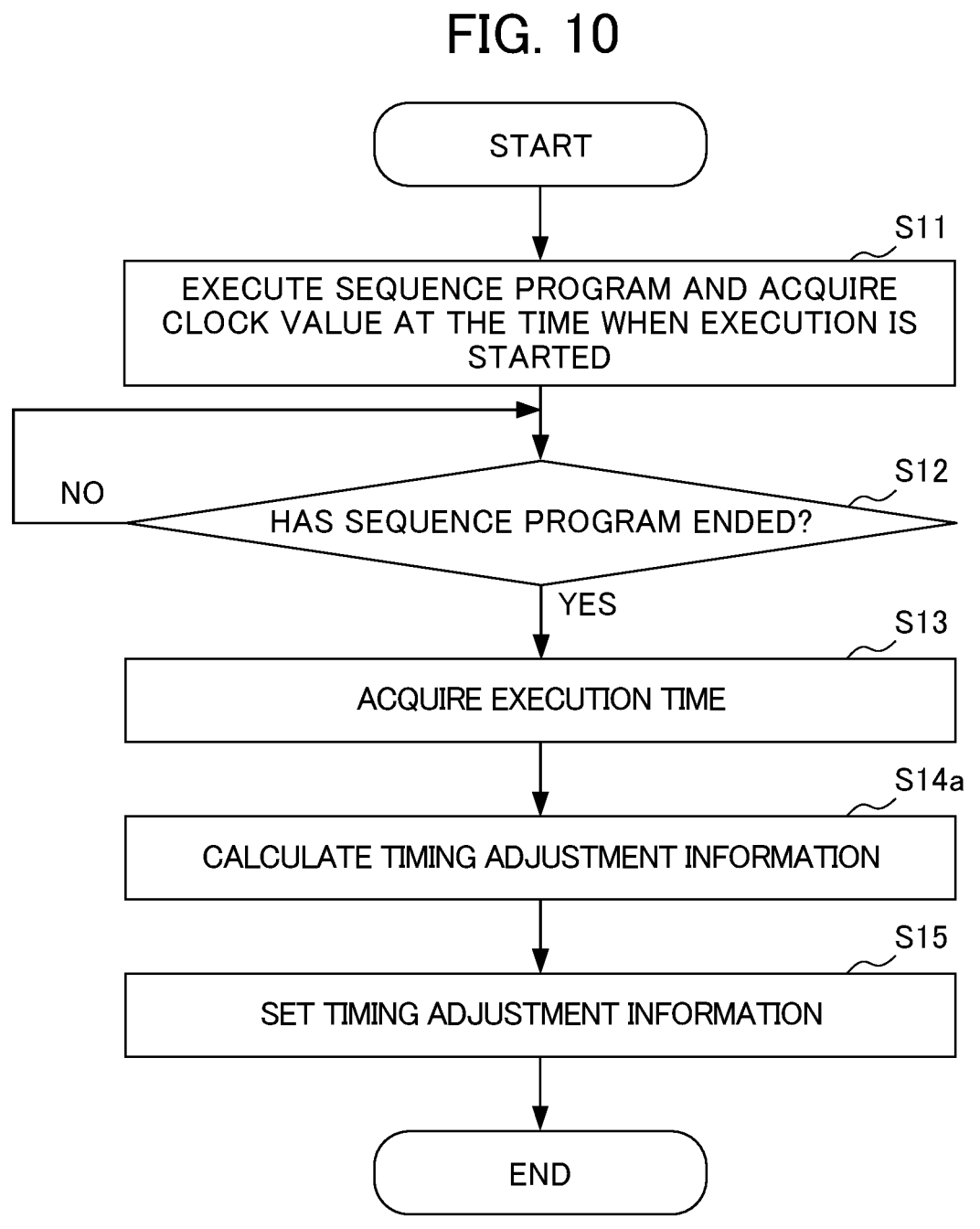

FIG. 10 is a flowchart illustrating the process of the PLC 21$a$ in the test execution mode. The flow shown here is executed each time the test execution mode is received from the PLC programming apparatus 30.

Since processes of Steps S11 to S13, and S15 are similar to the processes of Steps S11 to S13, and S15, description thereof will be omitted.

At Step S14$a$, the timing adjustment information calculation unit 222$a$ calculates timing adjustment information that includes the execution cycles $P_{cycle1}$ of the PLC 21$a$ in the cyclic execution mode of the sequence program, based on the execution time $T_{m1}$ acquired at Step S13. The timing adjustment information calculation unit 222$a$ transmits the calculated timing adjustment information to the PLC programming apparatus 30.

<Process of PLC 21$a$ in Cyclic Execution Mode>

Next, a flow of a process of the PLC 21$a$ in the cyclic execution mode will be described with reference to FIG. 11. As for the PLC 21$b$, a process similar to that of the PLC 21$a$ is also executed.

Figure 11:
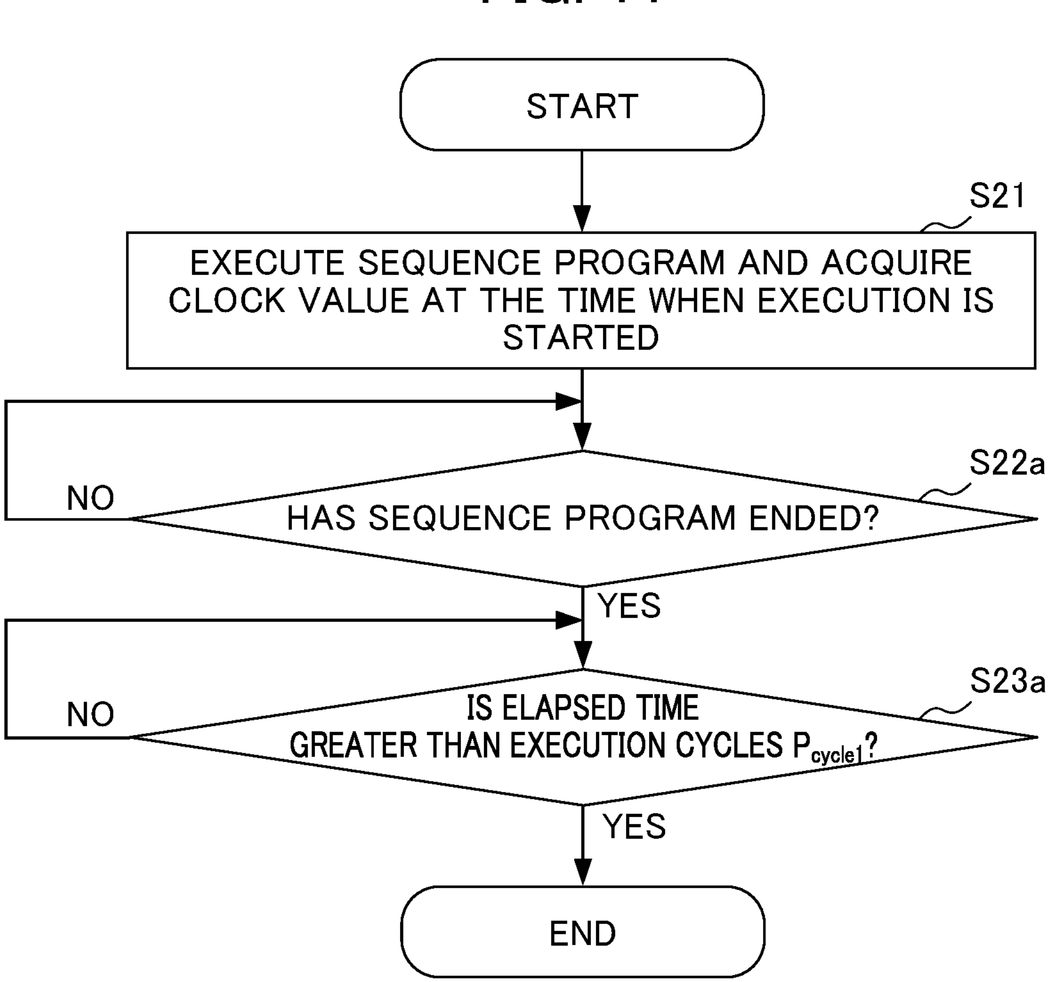
FIG. 11 is a flowchart illustrating a process of each of the PLCs in the cyclic execution mode.
Figure 13:
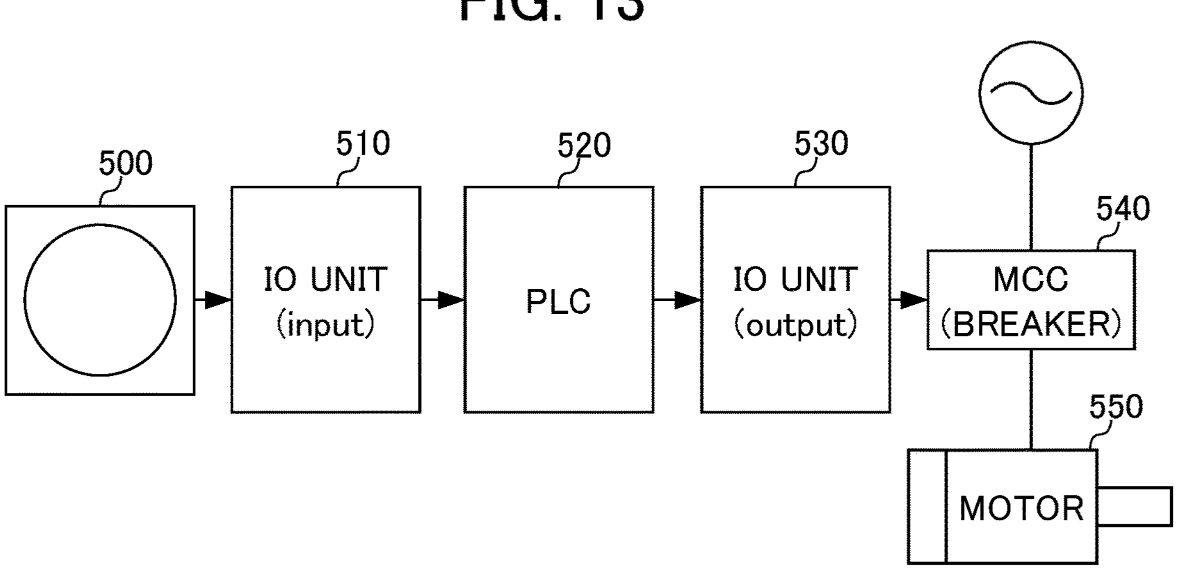
FIG. 13 is a diagram showing an example of a PLC without functional safety.
Figure 14:
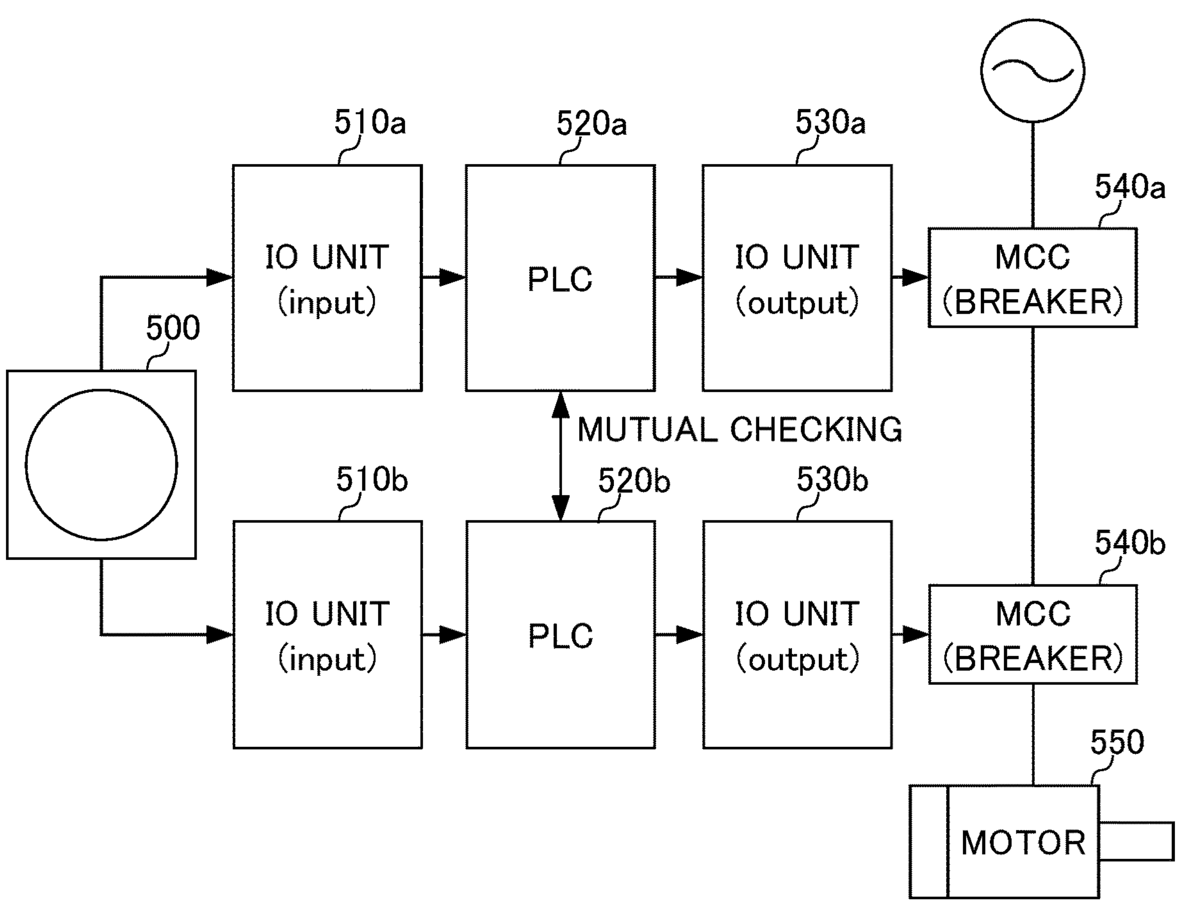
FIG. 14 is a diagram showing an example of a PLC with functional safety.
Figure 16:
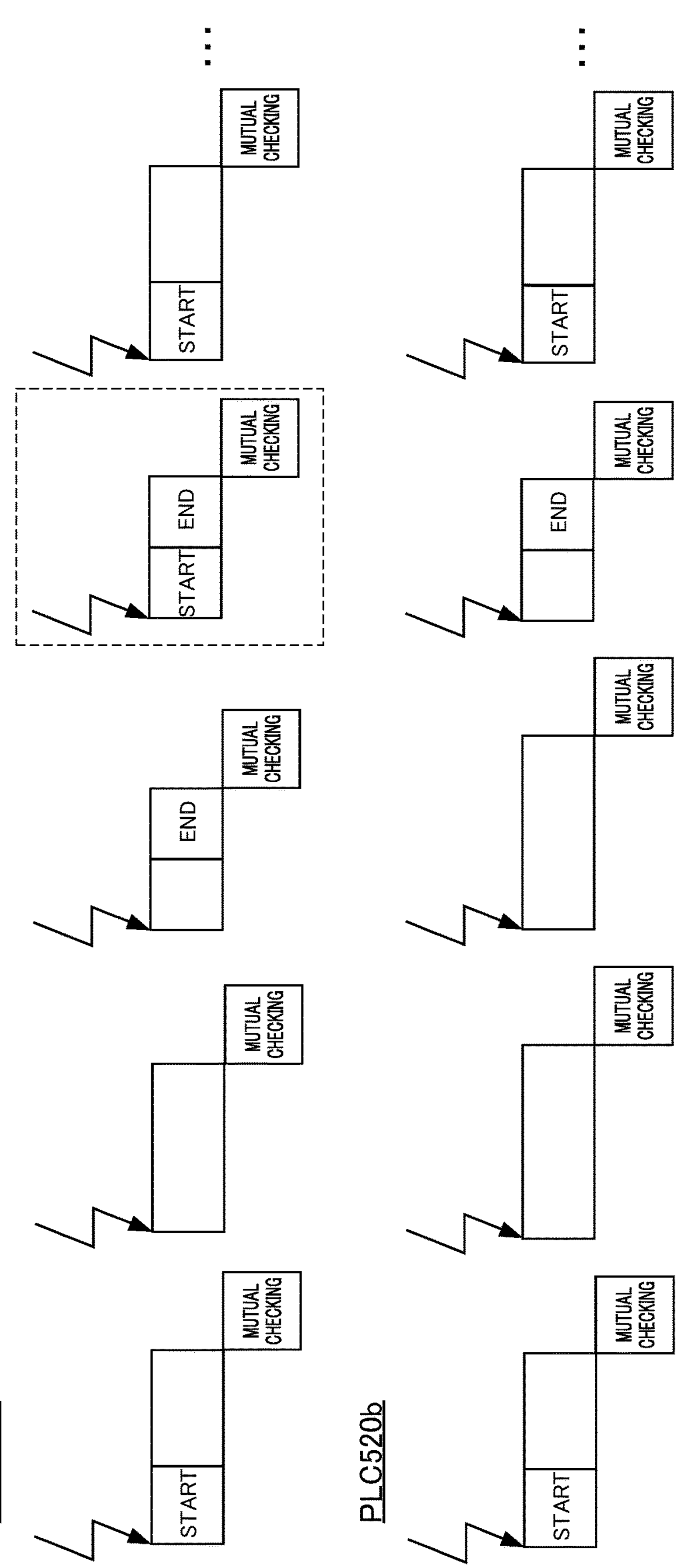
FIG. 16 is a diagram showing an example of a method for synchronizing the two PLCs.

FIG. 11 is a flowchart illustrating the process of the PLC 21$a$ in the cyclic execution mode. The flow shown here is executed for each scan of the PLC 21$a$.

Since a process of Step S21 is similar to the process of Step S21 of the first embodiment, description thereof will be omitted.

At Step S22$a$, the PLC execution unit 210 judges whether execution of the sequence program has ended or not. If the execution of the sequence program has ended, the process proceeds to Step S23$a$. On the other hand, if the execution of the sequence program has not ended, the process waits at Step S22$a$.

At Step S23$a$, the measurement unit 221 measures elapsed time from a difference between a clock value outputted from the CPU built-in clock or the like not shown and a clock value acquired at Step S21, and the PLC execution unit 210 judges whether the measured elapsed time has exceeded execution cycles $P_{cycle1}$ or not. If the measured elapsed time has exceeded the execution cycles $P_{cycle1}$, the execution cycle (scan) is ended, and the process transitions to the next execution cycle (scan). On the other hand, if the elapsed time is equal to or shorter than the execution cycles $P_{cycle1}$, the process waits at Step S23$a$.

Since an adjustment/setting process (a safety function setup mode) of the PLC programming apparatus 30 is similar to the case of FIG. 7, description thereof will be omitted.

FIG. 12 is a diagram showing an example of operations of the PLCs 21$a$ and 21$b$ in the cyclic execution mode when the execution cycles of the PLC 21$a$ has been adjusted.

As shown in FIG. 12, the PLC 21*a* the execution speed of the CPU of which is higher, and for which the execution cycles has been adjusted is adjusted so that the program performs scanning once from start to end in four cycles the same as the PLC 21*b*, by the execution cycles being fixed based on the timing adjustment information.

From the above, by each of the PLCs 21*a* and 21*b* calculating timing adjustment information in the test execution mode, the safety PLC apparatus 20 according to the second embodiment can make it possible to absorb the performance difference between the two PLCs 21*a* and 21*b*, by setting, for example, a parameter for the safety PLC apparatus 20 without modifying the sequence program in order to eliminate the difference between the execution speeds and, thereby, eliminate the burden on the user who designs the functional safety system 1.

Further, the safety PLC apparatus 20 calculates a setting for a parameter related to PLC execution timing adjustment not by estimation but from actual execution time and, therefore, can set highly accurate timing adjustment information. The second embodiment has been described above.

The first and second embodiments have been described above. The safety PLC apparatus 20, however, is not limited to the embodiments described above but includes modifications, improvements, and the like within a range in which the object can be achieved.

Modification Example 1

In the first and second embodiments, it is assumed that the execution speed of the PLC 21*a* is higher than the execution speed of the PLC 21*b*. The present invention, however, is not limited thereto. For example, the execution speed of the PLC 21*b* may be higher than the execution speed of the PLC 21*a*. In this case, the timing adjustment information calculation unit 222 of the PLC 21*b* may calculate the execution time $T_{cycle2}$ of the CPU of the control unit 200 of the PLC 21*b* as $T_{m2}/T_{m1}\times Td$. Further, the timing adjustment information calculation unit 222 of the PLC 21*b* may calculate the execution cycles $P_{cycle2}$ of the CPU of the control unit 200 of the PLC 21*a* as an integer rounded up from $T_{m1}/Td$. Then, the timing adjustment information calculation unit 222 may transmit timing adjustment information that includes at least either the calculated execution time $T_{cycle2}$ or the execution cycles $P_{cycle2}$ to the PLC programming apparatus 30 via the communication unit 22.

Meanwhile, the timing adjustment information calculation unit 222 of the PLC 21*a* may transmit execution time measured by the measurement unit 221 and the execution cycles set for the timing adjustment information 232, to the PLC programming apparatus 30 as timing adjustment information about the PLC 21*a*.

Modification Example 2

For example, in the first and second embodiments, the safety PLC apparatus 20 adjusts the timing adjustment information about the PLC 21*a* or 21*b* with a higher execution speed. The present invention, however, is not limited thereto. For example, the safety PLC apparatus 20 may adjust the execution time or the execution cycles of the PLC 21*a*, and the execution time or the execution cycles of the PLC 21*b* to a predetermined execution time or the execution cycles set in advance.

Modification Example 3

For example, in the first and second embodiments, each of the PLCs 21*a* and 21*b* has the execution time adjustment unit 220 and the timing adjustment information 232. The present invention, however, is not limited thereto. For example, only the PLC 21*a* or 21*b* for which the timing adjustment information is adjusted may have the execution time adjustment unit 220 and the timing adjustment information 232.

Each function included in the safety PLC apparatus 20 of each of the first and second embodiments can be realized by hardware, software, or a combination thereof. Here, being realized by software means being realized by a computer reading and executing a program.

All or a part of the safety PLC apparatus 20 of each of the first and second embodiments described above can be realized by hardware, software, or a combination thereof. Here, being realized by software means being realized by a computer reading and executing a program. In the case of being configured with hardware, a part or all of functions of the safety PLC apparatus 20 can be configured with an integrated circuit (IC), for example, an LSI (large scale integrated circuit), an ASIC (application specific integrated circuit), a gate array, or an FPGA (field programmable gate array).

In the case of configuring all or a part of the safety PLC apparatus 20 with software, all or the part of the safety PLC apparatus 20 can be realized by, in a computer configured with a storage unit, such as a hard disk or a ROM, storing a program in which all or a part of the operation of the safety PLC apparatus 20 is written, a DRAM storing data required for arithmetic operation, a CPU, and a bus connecting the units, storing information required for arithmetic operation in the DRAM and causing the program to operate by the CPU.

The programs can be supplied to the computer by being stored on any of various types of non-transitory computer readable media. The non-transitory computer readable media include various types of tangible storage media. Examples of non-transitory computer readable media include magnetic storage media (such as flexible disks, magnetic tape, and hard disk drives), magneto-optical storage media (such as magneto-optical disks), compact disc read only memory (CD-ROM), compact disc recordable (CD-R), compact disc rewritable (CD-R/W), and semiconductor memory (such as mask ROM, programmable ROM (PROM), erasable PROM (EPROM), flash ROM, and RAM). Alternatively, the programs may be supplied to the computer using any of various types of transitory computer readable media. Examples of transitory computer readable media include electrical signals, optical signals, and electromagnetic waves. Such transitory computer readable media are able to supply the programs to the computer through a wireless communication channel or a wired communication channel such as electrical wires or optical fibers.

Steps describing the program recorded in a recording medium include not only processes that are performed chronologically in the order thereof but also processes that are not necessarily performed chronologically but are executed in parallel or individually.

In other words, a PLC apparatus and a storage medium of the present disclosure can take various embodiments having the following configurations.

(1) A safety PLC apparatus 20 of the present disclosure is a PLC apparatus including a first PLC 21*a* and a second PLC 21*b*, the PLC apparatus causing a PLC execution unit 210 of each of the first PLC and the second PLC to perform test execution of a sequence program, and the PLC apparatus including: a measurement unit 221 configured to measure time required by the PLC execution unit 210 of each of the first PLC and the second PLC from start to end of the sequence program; a timing adjustment information calculation unit 222 configured to calculate, based on the time measured by the measuring unit 221, timing adjustment information including at least either execution time or execution cycles in cyclic execution of the sequence program in the first PLC and the second PLC; and a timing adjustment information setting unit 223 configured to set the timing adjustment information calculated by the timing adjustment information calculation unit 222; wherein the timing adjustment information is set for at least any one of the first PLC 21*a* and the second PLC 21*b*. According to the safety PLC apparatus 20, it is made possible to absorb the performance difference between the two PLCs 21*a* and 21*b*, for example, by setting a parameter for the safety PLC apparatus 20 without modifying the sequence program, in order to eliminate the difference between the execution speeds, and it is possible to eliminate the burden on a user who designs the functional safety system 1.

(2) The safety PLC apparatus 20 according to (1) may include a switching unit 224 configured to switch between a mode for performing the test execution and a mode for performing the cyclic execution to which the timing adjustment information is applied.

By doing so, the safety PLC apparatus 20 can have effects similar to those of (1).

(3) The safety PLC apparatus 20 according to (1) or (2) may further include a communication unit 22 configured to transmit the timing adjustment information of the first PLC and the second PLC calculated by the timing adjustment information calculation unit 222, to a PLC programming apparatus 30, and receive a setting instruction for the transmitted timing adjustment information, from the PLC programming apparatus 30; and the timing adjustment information setting unit 223 may set the timing adjustment information 223 to at least any of the first PLC 21*a* and the second PLC 21*b*, based on the received setting instruction.

By doing so, the safety PLC apparatus 20 calculates a setting for a parameter related to PLC execution timing adjustment not by estimation but from actual execution time and, therefore, can set highly accurate timing adjustment information.

(4) The safety PLC apparatus 20 according to (3) may further include a rewriting unit 225 configured to execute, in order to reproduce a predetermined situation in the test execution, rewriting of the sequence program, rewriting of a signal state in the safety PLC apparatus 20, or rewriting of program variables 234, based on an instruction from the PLC programming apparatus 30 via the communication unit 22.

By doing so, the safety PLC apparatus 20 can reproduce a predetermined situation in the test execution mode.

(5) A recording medium of the present disclosure is a computer-readable recording medium recording therein a program for causing a computer to function as the following units to cause a PLC execution unit 210 of each of the first PLC 21*a* and the second PLC 21*b* to perform test execution of a sequence program: a measurement unit 221 configured to measure time required by the PLC execution unit 210 of each of the first PLC and the second PLC from start to end of the sequence program in the test execution; a timing adjustment information calculation unit 222 configured to calculate, based on the measured time, timing adjustment information including at least either execution time or execution cycles in cyclic execution of the sequence program in the first PLC and the second PLC; and a timing adjustment information setting unit 223 configured to set the calculated timing adjustment information for the first PLC 21*a* or the second PLC 21*b*; wherein the timing adjustment information is set for at least one of the first PLC and the second PLC.

According to the recording medium, effects similar to those of (1) can be obtained.

EXPLANATION OF REFERENCE NUMERALS

- 1 Functional safety system
- 10*a*, 10*b* IO Input/output apparatus
- 20 Safety PLC apparatus
- 21*a*, 21*b* PLC
- 22 Communication unit
- 200, 200*a* Control unit
- 210 PLC execution unit
- 220, 220*a* Execution time adjustment unit
- 221 Measurement unit
- 222, 222*a* Timing adjustment information calculation unit
- 223 Timing adjustment information setting unit
- 224 Switching unit
- 225 Rewriting unit
- 230 Storage unit
- 231 Signal state
- 232 Timing adjustment information
- 233 Sequence program
- 234 Program variables
- 30 PLC programming apparatus

The invention claimed is:

1. A Programmable Logic Controller (PLC) apparatus comprising a first PLC and a second PLC whose execution speeds are different from each other, the PLC apparatus causing a PLC execution unit of each of the first PLC and the second PLC to perform test execution of a sequence program, the PLC apparatus comprising:

a measurement unit configured to measure time required by the PLC execution unit of each of the first PLC and the second PLC from start to end of the sequence program;

a timing adjustment information calculation unit configured to calculate, based on the time measured by the measuring unit, timing adjustment information including at least either execution time or execution cycles in cyclic execution of the sequence program in the first PLC and the second PLC; and a timing adjustment information setting unit configured to set the timing adjustment information calculated by the timing adjustment information calculation unit; wherein the timing adjustment information is set for at least any one of the first PLC or the second PLC having the higher execution speed.

2. The PLC apparatus according to claim 1, comprising a switching unit configured to switch between a mode for performing the test execution and a mode for performing the cyclic execution to which the timing adjustment information is applied.

3. The PLC apparatus according to claim 1, further comprising a communication unit configured to transmit the timing adjustment information of the first PLC and the second PLC calculated by the timing adjustment information calculation unit, to an external apparatus, and receive a setting instruction for the transmitted timing adjustment information, from the external apparatus, wherein the timing adjustment information setting unit sets the timing adjustment information to at least any of the first PLC and the second PLC based on the received setting instruction.

4. The PLC apparatus according to claim 3, further comprising a rewriting unit configured to execute, in order to reproduce a predetermined situation in the test execution, rewriting of the sequence program, rewriting of a signal state in the PLC apparatus, or rewriting of program variables, based on an instruction from the external apparatus via the communication unit.

5. A non-transitory computer readable medium encoded with a program for causing a computer to function as the following units to cause a Programmable Logic Controller (PLC) execution unit of each of a first PLC and a second PLC whose execution speeds are different from each other to perform test execution of a sequence program:

a measurement unit configured to measure time required by the PLC execution unit of each of the first PLC and the second PLC from start to end of the sequence program in the test execution;

a timing adjustment information calculation unit configured to calculate, based on the measured time, timing adjustment information including at least either execution time or execution cycles in cyclic execution of the sequence program in the first PLC and the second PLC; and a timing adjustment information setting unit configured to set the calculated timing adjustment information for the first PLC or the second PLC, wherein the timing adjustment information is set for at least one of the first PLC or the second PLC having the higher execution speed.

* * * * *